US00RE37707E

(19) United States
(12) Reissued Patent
Bozzini et al.

(10) Patent Number: US RE37,707 E
(45) Date of Reissued Patent: May 21, 2002

(54) LEADFRAME WITH HEAT DISSIPATOR CONNECTED TO S-SHAPED FINGERS

(75) Inventors: Pieramedeo Bozzini, Sedriano; Giuseppe Marchisi, Milan, both of (IT)

(73) Assignee: STMicroelectronics S.r.l., Agrate Brianza (IT)

(21) Appl. No.: 08/674,661

(22) Filed: Jul. 2, 1996

Related U.S. Patent Documents

Reissue of:
(64) Patent No.: 5,113,240
Issued: May 12, 1992
Appl. No.: 07/656,386
Filed: Feb. 19, 1991

U.S. Applications:

(63) Continuation of application No. 08/228,649, filed on Apr. 18, 1994, now abandoned.

(30) Foreign Application Priority Data

Feb. 22, 1990 (IT) ..... 19445 A/90

(51) Int. Cl.[7] ..... H01L 29/495
(52) U.S. Cl. ..... 257/675; 257/666; 257/676
(58) Field of Search ..... 257/666, 676, 257/675

(56) References Cited

U.S. PATENT DOCUMENTS

| | | | | |
|---|---|---|---|---|
| 3,423,516 A | | 1/1969 | Segerson | 174/52 |
| 3,629,672 A | | 12/1971 | Van de Water | 317/234 R |
| 3,839,660 A | * | 10/1974 | Stryker | 257/787 |
| 4,095,253 A | | 6/1978 | Yoshimura et al. | 357/81 |
| 4,807,018 A | | 2/1989 | Cellai | 357/70 |
| 4,809,053 A | | 2/1989 | Kuraishi | 357/70 |
| 4,963,975 A | | 10/1990 | Sawaya | 357/81 |
| 4,965,642 A | * | 10/1990 | Titterington | 257/787 |
| 5,073,817 A | * | 12/1991 | Ueda | 257/787 |

FOREIGN PATENT DOCUMENTS

| | | |
|---|---|---|
| JP | 0124678 | 9/1979 |
| JP | 0053752 | 3/1986 |

OTHER PUBLICATIONS

Hitachi Power Mosfet Data Book, Aug., 1995, #D11, p. 201, 2SK511, Silicon N–Channel MOS FET.

International Rectifier, Product Digest, Short Form Catalog 90, HEXFET Power MOSFETs Case Outlines, pp. 1 and 140, 1990.

* cited by examiner

*Primary Examiner*—Sheila V. Clark
(74) *Attorney, Agent, or Firm*—Lisa K. Jorgenson; James H. Morris

(57) ABSTRACT

An improved leadframe for packages of integrated power devices which, by virtue of its configuration, allows to press the dissipator on the bottom of the shell during the molding of the plastic case, without the dissipator having exposed portions of its inner face (which is in contact with the chip). In order to achieve this, the leadframe according to the invention comprises a monolithic body which defines a perimetric frame, the leads and the dissipator. The dissipator extends in a depressed plane with respect to the frame and is connected to the frame and to the leads in at least three step-like points which are mutually spaced and non-aligned. During the molding of the plastic case, a pressure is exerted on the frame and is transmitted to the dissipator by the three step-like points, so that the dissipator is effectively pressed flat against the bottom of the mold without using pushers which pass through the plastic case.

39 Claims, 5 Drawing Sheets

LEADFRAME WITH HEAT DISSIPATOR CONNECTED TO S-SHAPED FINGERS

Matter enclosed in heavy brackets [ ] appears in the original patent but forms no part of this reissue specification; matter printed in italics indicates the additions made by reissue.

*This application is a continuation of application Ser. No. 08/228,649, filed Apr. 18, 1994, now abandoned, which is a reissue of Ser. No. 07/656,386.*

BACKGROUND OF THE INVENTION

The present invention relates to an improved leadframe for packages of integrated power devices. In particular, the present invention is related to medium-power integrated circuits.

As is known, in the manufacture of integrated power devices, the chip of semiconductor material which integrates the electronic components is welded to a dissipator which is connected to a leadframe. Generally, the dissipator, which is thicker than the leadframe and is arranged on a different plane, is manufactured separately and is connected mechanically to the leadframe so that its face which is to be welded to the chip is directed toward the leads. Then, after the provision of the interconnections between the chip and the leads or terminals, a plastic case of epoxy resin, with a generally parallelepipedal shape, is molded on one face of the dissipator and completely embeds the chip. In particular, the plastic case only partially covers the face of the dissipator which is in contact with the chip (the inner face), whereas the opposite face of the dissipator must remain as free as possible from resin traces, in order to ensure the required heat dissipation, particularly when the dissipator is fixed to a further external dissipation structure. This entails on one hand the need to prevent as much as possible the resin of the plastic case from reaching the outer face of the dissipator during molding, and on the other hand the need to clean said face from any residues (deflashing).

In order to reduce the residues on the exposed or outer side of the dissipator, according to the known solutions, the dissipator is pressed against a bottom of the mold by means of pushers provided in the mold of the plastic case, so as to prevent the penetration of the resin, which is injected in the fluid state and under pressure, between the outer face of the dissipator and the bottom of said mold. However, this solution is disadvantageous. In order to press the dissipator flat so that it adheres as much as possible to the bottom of the mold without lifting in any point, three pushers which act on the "inner" face of the dissipator are in fact used: specifically, one of the pushers acts on a portion of the dissipator which is thus external to the perimeter of the plastic case, and the other two pass through the resin, so that the plastic case has notches or recesses which are not filled with resin and reach the inner face of the dissipator, exposing part thereof.

A finished package manufactured in the described manner can be seen for example in FIG. 1, wherein the reference numeral 1 indicates the package as a whole, 2 indicates the dissipator, 3 indicates the molded epoxy-resin plastic case, and 4 indicates the leads or terminals, which are already bent. The reference numeral 5 indicates the portion of the dissipator which is not covered by the plastic of the case 3, since a first pusher acts thereon and laterally delimits the perimeter of the plastic case, whereas the numerals 6 indicate cavities in the resin which are caused by the presence of the pushers in the mold. Said cavities expose further portions of the inner face of the dissipator, only one of which, indicated by 7, is visible in the figure. The reference numeral 8 indicates the hole for the passage of the screw for connection to an external structure or plate for increasing heat dissipation.

However, the exposure of even only part of the inner face of the dissipator is unwanted, since said face is not protected against external influences during the further manufacturing steps (e.g. nickel-plating for the coating of the leads), and in particular it facilitates the penetration of humidity inside the package, reducing the life and therefore the reliability of the device.

Due to the presence of the pushers, the mold furthermore has a relatively complicated and therefore expensive configuration.

Nonetheless, part of the resin still succeeds to infiltrate below the dissipator, so that it must be removed.

SUMMARY OF THE INVENTION

Given this situation, the aim of the present invention is to provide an improved leadframe for packages of integrated power devices which can solve the disadvantages of the prior art.

Within the scope of this aim, a particular object of the present invention is to provide an improved leadframe which has such a configuration that no pushers which pass through the resin and cause interruptions therein are required during the molding of the plastic case.

In particular, an object of the present invention is to provide a leadframe by virtue of which, after the molding of the plastic case, the inner face of the dissipator which is in contact with the chip is completely covered by the resin, so that it is protected against external contaminating agents, avoiding thus the deposit of resin residues on the outer side of the dissipator.

An important object of the present invention is to provide a leadframe which allows to obtain a significant simplification in the mold for the plastic case, with a reduction in manufacturing costs.

Not least object of the present invention is to provide a leadframe which does not entail modifications in the other steps of the manufacture of the integrated device.

This aim, these objects and others which will become apparent hereinafter are achieved by an improved leadframe for packages of integrated power devices.

The present furthermore relates to an intermediate structure for obtaining a non-planar leadframe, to a power package which comprises the non-planar leadframe according to the invention, and to a process for the manufacture of the non-planar leadframe and the molding of the plastic case.

BRIEF DESCRIPTION OF THE DRAWINGS

The characteristics and advantages of the invention will become apparent from the description of a preferred embodiment, illustrated only by way of non-limitative example in the accompanying drawings, wherein:

FIG. 1 is not described hereinafter; reference to the above description is made for said figure.

DESCRIPTION OF THE PREFERRED EMBODIMENTS

Figure 1:
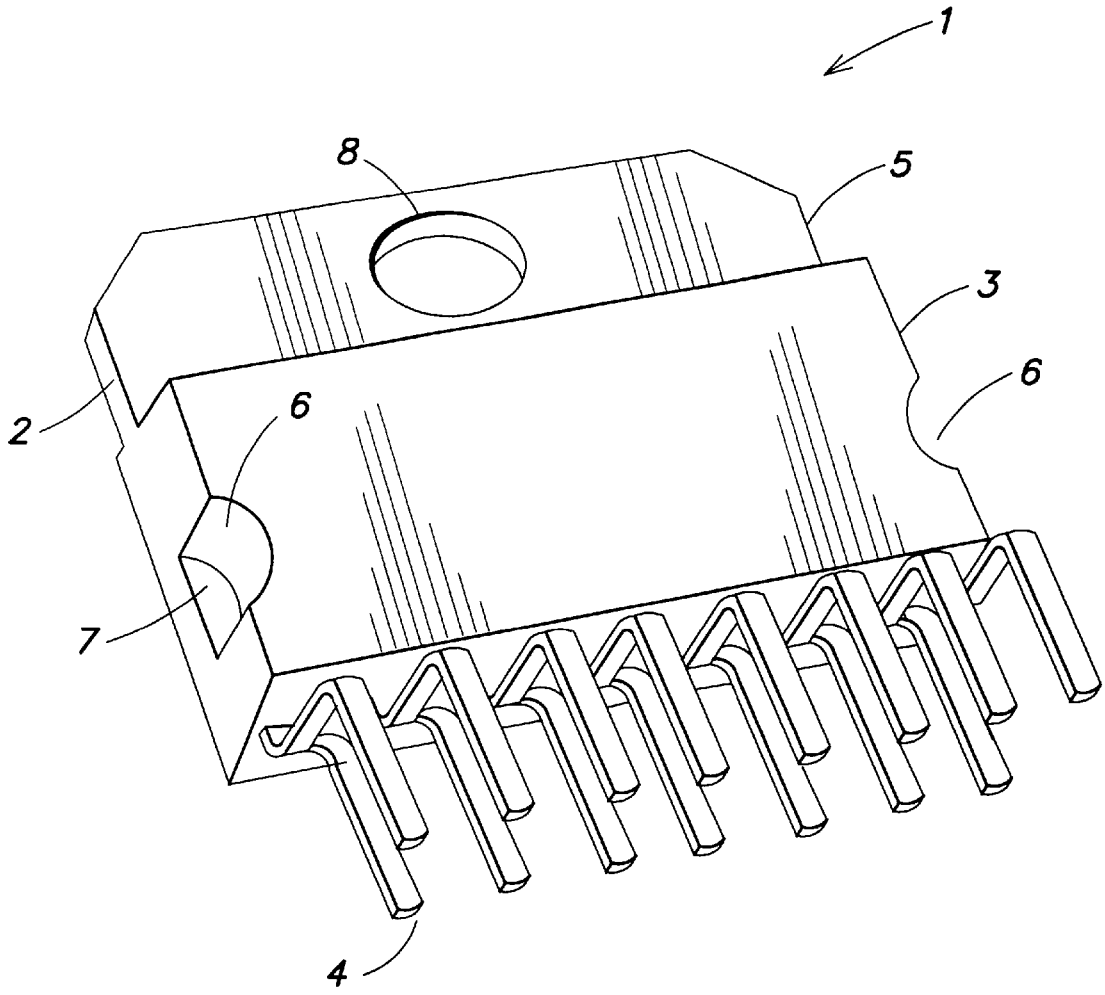
FIG. 1 (PRIOR ART)
FIG. 1 is a perspective view of a package for integrated power devices which uses a leadframe with dissipator of a known type.
Figure 2:
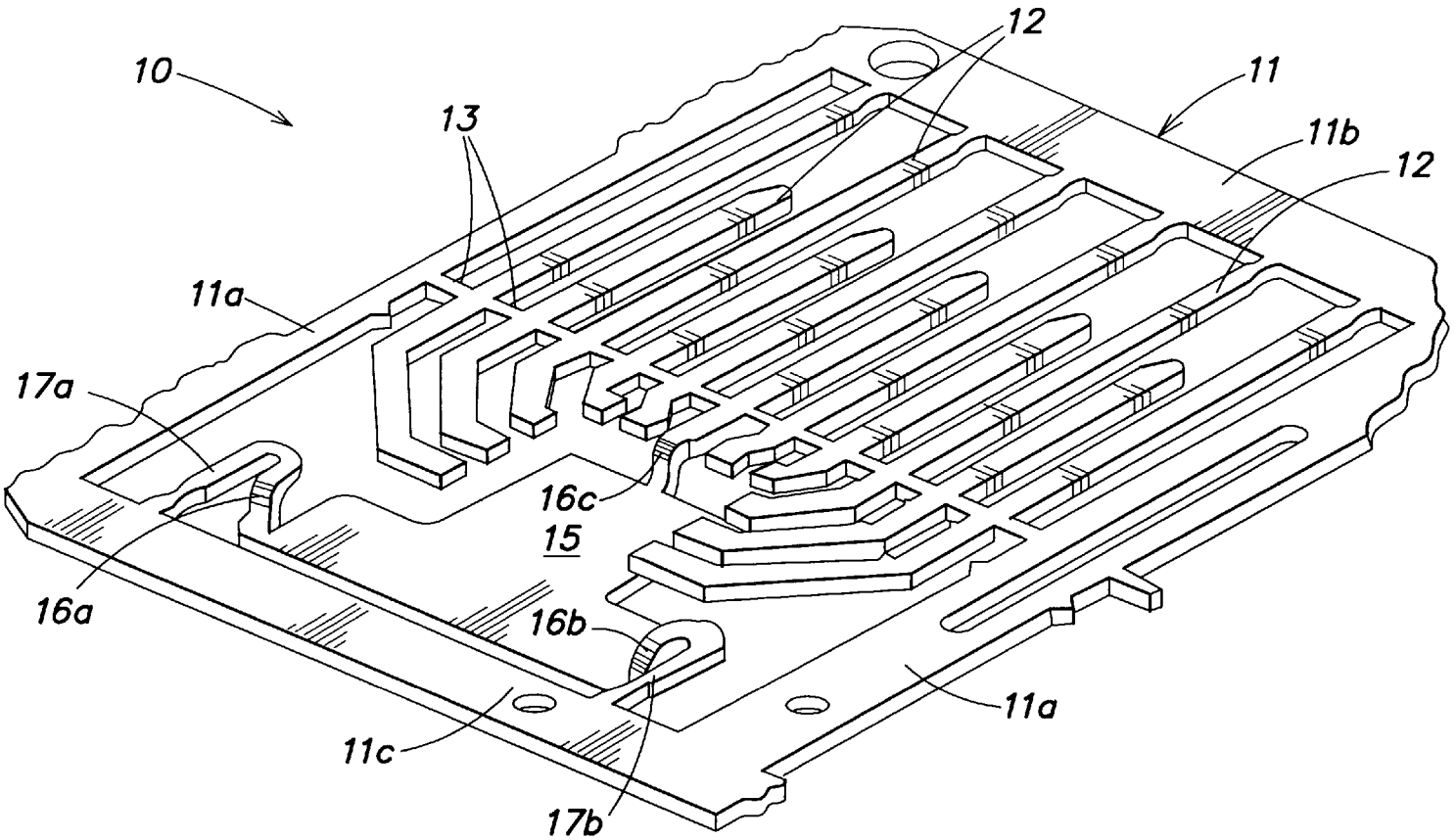
FIG. 2 is a perspective view of the leadframe according to the invention.

With reference to FIG. 2, the leadframe according to the invention is generally indicated by the reference numeral 10 and is part of a strip which comprises for example ten of said leadframes, all identical and arranged side by side. In detail, the leadframe comprises a frame 11 which, according to the invention, extends along a substantially rectangular closed line which defines the outer perimeter of the leadframe. The sides of the frame indicated by 11a are in common with the adjacent leadframes (not illustrated in the figure) of the same strip. The frame 11 supports the leads 12 (eleven in the illustrated example), some of which are connected to the side 11b of the frame at their tip, whereas all the leads are connected to an intermediate portion of the sides 11a of the frame by means of segments 13 which define an interconnection line. Similarly to the prior art, the lead interconnection segments 13 are intended to be removed, together with the frame 11, after the execution of the plastic case.

The leadframe according to the invention furthermore supports a depressed portion 15, which defines the dissipator, which is manufactured monolithically with the rest of the leadframe and is connected thereto at three points by means of connections 16a–16c and fingers 17a, 17b. In particular, the dissipator is substantially shaped like a T, the stem 15a whereof extends in the space not occupied by the leads (see in particular FIG. 3, which illustrates the leadframe prior to the deformation and lowering of the dissipator, but which also substantially corresponds to the plan view of the deformed leadframe, apart from a slight downward shift of the dissipator toward the side 11b of the frame due to the deformation of the connections 16a, 16b and downward shift of the dissipator toward the side 11b of the frame due to the deformation of the connections 16a, 16b and 16c so as to form steps ) and is connected to the central lead by means of the step-like connection 16c. The transverse portion or side of the T, which is indicated by 15b, is instead connected to the side 11c of the frame by means of the connections 16a, 16b, which extend from the corners of the longitudinal ends of the side 15b which face the side 11c; said connections 16a, 16b are connected to said side 11c of the frame by means of fingers 17a, 17b. In particular, as is clearly visible in FIG. 3, the fingers 17a, 17b (which preferably have a tapered portion 18 suitable for facilitating the subsequent separation of the frame from the package) extend from the side 11c in a direction which is substantially perpendicular thereto toward the side 11b, then form a 180° curve and continue with the connections or sides 16a, 16b, which are then orientated toward the side 11c and connect to the dissipator 15. In practice, the fingers 17a, 17b and the connections 16a, 16b form an S which is intended, as described in greater detail hereinafter, to be embedded inside the plastic case, so as to minimize the probability of the entry of humidity toward the inner face of the dissipator.

Figure 3:
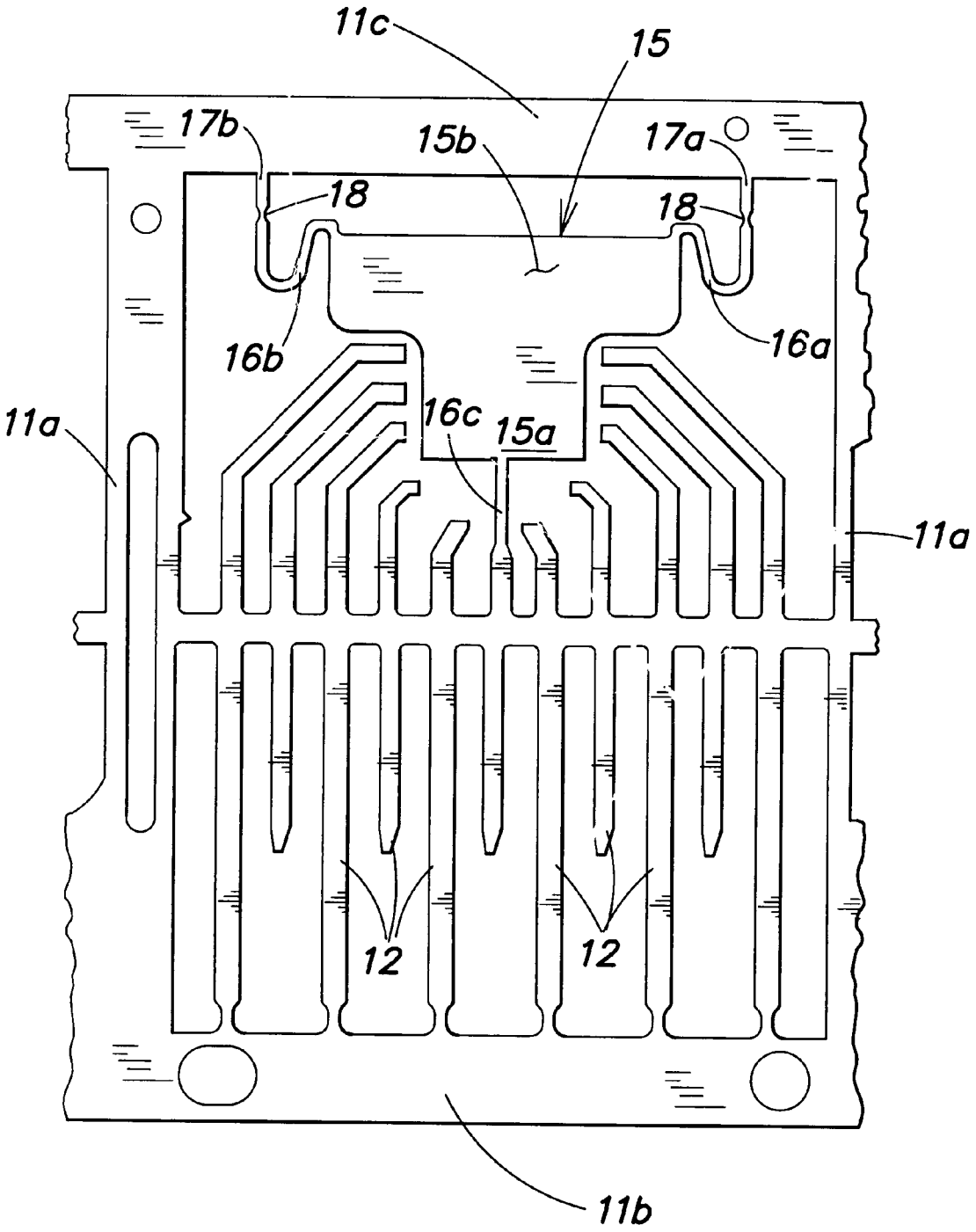
FIG. 3 is a plan view of the intermediate structure for obtaining the leadframe according to the invention.

The leadframe according to the invention, illustrated in FIG. 2, is obtained, as mentioned, starting from an intermediate planar monolithic structure (monoframe) which is illustrated in FIG. 3. Said structure, which is obtained by means of conventional methods starting from a strip of appropriate material, typically copper, is deformed mechanically (e.g. by drawing) so as to bend the connections 16a, 16b and 16c and lower the dissipator with respect to the plane of the leads. The lowering of the dissipator is appropriately chosen so that the difference in level between said dissipator and the plane of the frame and of the leads is slightly larger than the depth of the shell against the bottom of which the dissipator is pressed. In practice, preferably, once the dissipator has been placed against the bottom of the related shell, the frame, and in particular the connections 16a–16c, protrude vertically beyond the edge of the shell by 1–2 hundredths of a millimeter, so that after the closure of the mold the pressure exerted on the frame and on the outer part of the leads is transmitted to the dissipator by means of the connections 16a–16c, pressing the dissipator on three points against the bottom of the shell. By virtue of the action on said three points, the resin cannot practically penetrate between the bottom of the mold and the dissipator, except for unavoidable and very small residues, which can be easily removed by means of the conventional deflashing method. The fact should be stressed that since the pressure is exerted directly on the frame, (which is external to the mold and is not affected by the plastic case, and is transmitted through the fingers 17a, 17b and the internal portion of the lead which is connected to the connection 16c, as well as through said connections 16a–16c), the plastic case has no openings or interruptions which expose even only part of the inner face of the dissipator.

Figure 4:
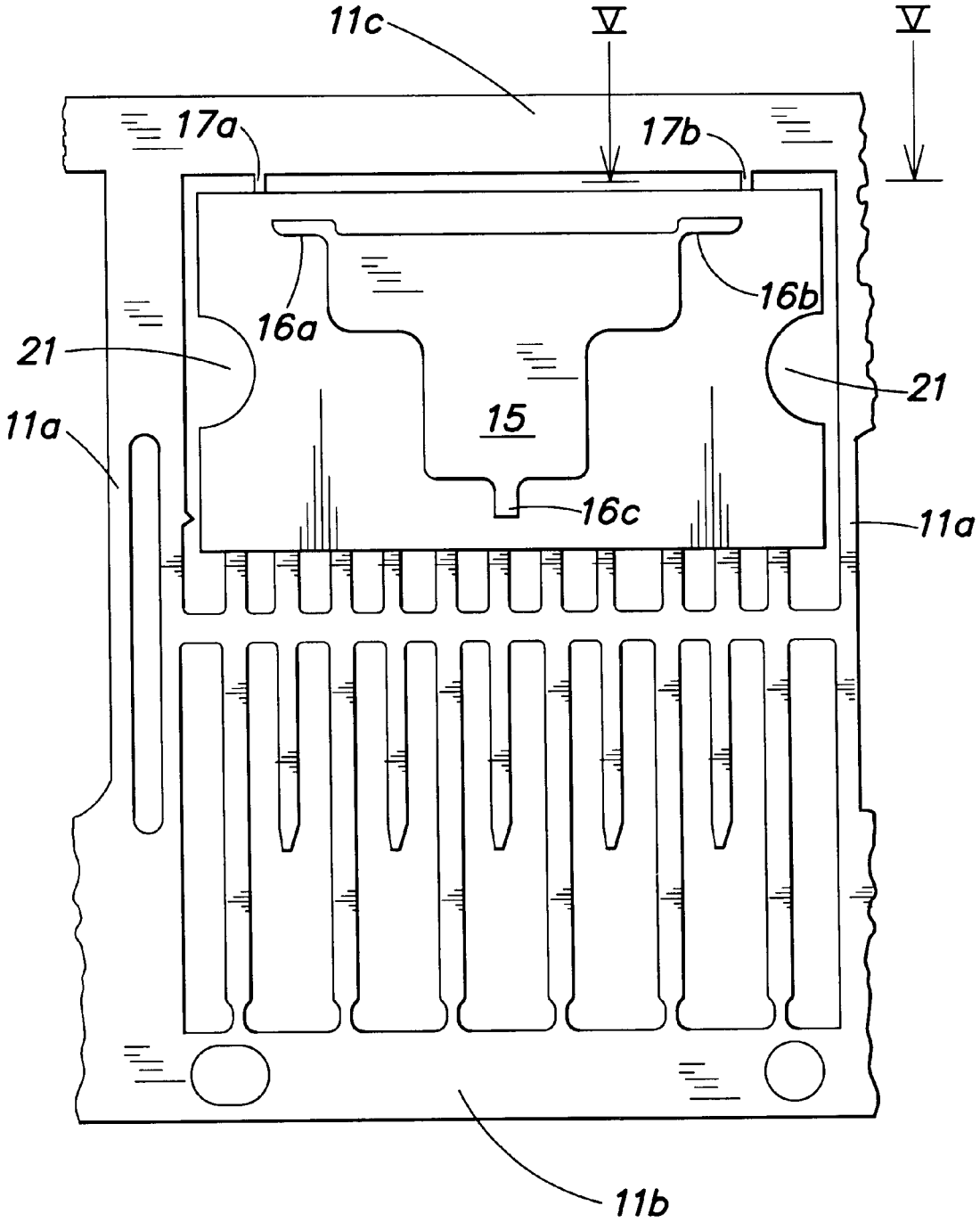
FIG. 4 is a bottom plan view of the leadframe according to the invention after the molding of the plastic case.
Figure 5:
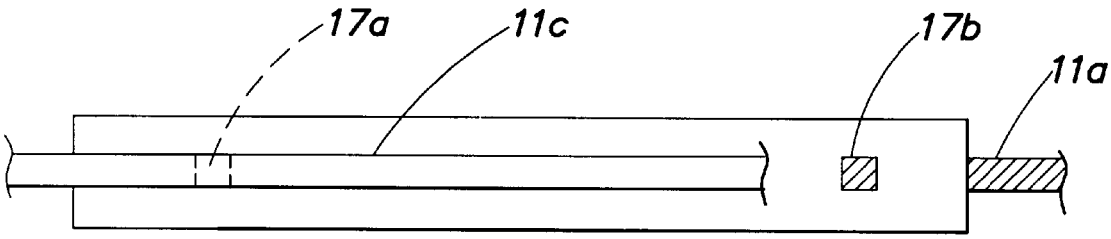
FIG. 5 is a partially sectional lateral elevation view of the structure of FIG. 4, taken along the line V—V.

FIGS. 4 and 5 illustrate the package immediately after the molding of the plastic case, so as to clearly illustrate the position of the dissipator with respect thereto. In particular, FIG. 4 illustrates the outer face of the dissipator 15 (which is opposite to the one visible in FIG. 2, onto which the chip is welded), part of the connections 16a–16c, which are partially deformed due to the pressure which acts during the closure of the mold, and the plastic case 20. As can be seen from the comparison of FIGS. 4 and 5, the dissipator has no parts which protrude beyond the lateral perimeter of the plastic case, since said plastic case completely covers the internal face of the dissipator and, on its rear side, which is shown in FIG. 4, it extends to the side of the dissipator and flush with its outer face.

Furthermore, as can be seen in particular in the right sectional part of FIG. 5, only the ends of the fingers 17a, 17b, which are to be removed (when the frame 11 and the segments 13 are separated from the case 20 and from the leads 12), protrude from the plastic case. Consequently, when the package is finished, only two small rectangles, related to the cross-section of the fingers 17a, 17b at the tapered portions 18, flush with the wall of the plastic case 20, will be visible on the side of the case visible in FIG. 5. However, these points do not constitute a possible entry path for humidity toward the inner face of the dissipator, due to the S-shaped configuration of the sunk part of the fingers 17a, 17b and of the connections 16a, 16b, which defines a convoluted path inside the case.

Finally, it should be noted that the plastic case 20 has two lateral recesses 21, so that the package can be fixed to an external dissipation structure. However, said recesses are not in contact with any part of the dissipator, so that they do not constitute access paths for humidity.

As can be seen from the above description, the invention brilliantly achieves the intended aim. An improved leadframe for packages of integrated power circuits has in fact been provided which does not require the use of pushers which pass through the resin of the plastic case to press the dissipator flat against the bottom of the mold. Consequently, there is no exposure of any part of the inner face of the dissipator, thus minimizing the access paths of humidity and at the same time avoiding as much as possible the penetration of resin below the dissipator. Any residues of resin which might nonetheless reach the outer surface of the dissipator are in any case small enough to be eliminated without great expenditure.

Furthermore, by virtue of the elimination of pressers acting inside the mold, said mold has a simpler configuration, so that its manufacture is facilitated and therefore more economical, to the advantage of the overall manufacturing costs of the finished integrated device.

The fact is stressed that despite the smaller surface of the dissipator according to the invention with respect to the known solutions, heat resistance is unchanged, and only heat capacity is reduced, so that the solution according to the invention is less advantageous from a thermal point of view only for integrated devices with pulsed-type operation.

The leadframe bending step does not entail high costs or expensive machinery, and the molding of the case is indeed simplified, as already mentioned, without requiring modifications in the other steps of the manufacturing process, so that the finished device has manufacturing costs which are compatible with the applications although it more reliable.

The invention thus conceived is susceptible to numerous modifications and variations, all of which are within the scope of the invention concept. In particular, the fact is stressed that although the illustrated solution, with three connecting points between the dissipator and the frame, is the most advantageous as regards on one hand the possibility of effectively compressing the dissipator flat on the bottom of the mold and on the other hand the simplicity of the structure, other connecting points, for example halfway along the side 15b which faces the frame 11c, may also be provided if this is necessary or advantageous.

All the details may furthermore be replaced with other technically equivalent ones.

We claim:

1. Improved leadframe for packages of integrated power device, comprising a monolithic body including a generally rectangular perimetric frame, a plurality of leads, a dissipator and at least one interconnection line supported by said frame, a plurality of leads mutually connected and supported by means of said at least one interconnection line, said dissipator extending in a depressed plane with respect to said frame and being connected to said frame and to said leads in at least three mutually spaced and non-aligned points, said frame being connected to said dissipator by means of s-like shape fingers which extend in three dimensions.

2. Leadframe according to claim 1, wherein said dissipator is connected to said frame in two points and is connected at a further point to a central lead of said plurality of leads.

3. Leadframe according to claim 2, wherein said frame has one side connected to the ends of at least some of said leads and the opposite side connected to said dissipator in said two points.

4. Leadframe according to claim 3, wherein said dissipator is substantially shaped like a T which has a transverse portion which extends substantially parallel to said opposite side of the frame and a stem which extends from said transverse portion toward said leads, said plurality of leads having free ends arranged in a U-like shape around said stem of said dissipator, said connections extending from the corners of said transverse portion which face said opposite side of said frame.

5. Leadframe according to claim 4, wherein said fingers extend in a direction which is substantially perpendicular to said opposite side of said frame, define a curve of approximately 180° and continue with step-like connections which are connected to said corners of the transverse portion.

6. Leadframe according to claim 4, wherein said stem of the dissipator is connected to said central lead by means of a step-like connection.

7. Package for integrated power devices, comprising a plastic case in which a chip of semiconductor material is embedded, a dissipator for supporting a chip and a plurality of leads which protrude partially from said plastic case, wherein said dissipator is integral with at least one of said leads and is connected thereto by means of a step-like connection, said dissipator being surrounded by said plastic case so that its face which supports said chip is completely covered by said plastic case and its opposite outer face extends flush with one of the larger surfaces of said plastic case, said dissipator having portions in the shape of a three-dimensional S which extend inside said plastic case and end at an intermediate portion of a lateral surface of said plastic case which is opposite to said leads.

8. Package according to claim 7, wherein said dissipator is shaped like a T having a transverse portion which extends parallel to said lateral surface of said plastic case and a stem portion which extends from said transverse portion toward said leads.

*9. A leadframe for an integrated circuit package, comprising:*

*a monolithic body including a generally rectangular perimetric frame and at least one interconnection line supported thereby;*

*a plurality of leads supported by said at least one interconnection line;*

*a dissipator extending in a depressed plane with respect to said frame; and*

*at least one connection finger that connects said dissipator to said frame, said at least one connection finger being curved in each of at least two orthogonal planes.*

*10. The leadframe of claim 9, wherein said at least one connection finger includes at least two connection fingers.*

*11. The leadframe of claim 10, wherein said at least two connection fingers are constructed and arranged so that pressure exerted on the frame is transmitted to said dissipator.*

*12. The leadframe of claim 10, wherein said perimetric frame includes four sides, and wherein said at least two connection fingers include two connection fingers that are each connected to a first side of said frame.*

*13. The leadframe of claim 12, wherein said first side extends substantially parallel to said interconnection line.*

*14. The leadframe of claim 13, further comprising a connection tab that connects said dissipator to said frame.*

*15. The leadframe of claim 14, wherein said connection tab is integrally connected to one of said plurality of leads.*

*16. The leadframe of claim 15, wherein the connection tab is curved in only a single plane.*

*17. The leadframe of claim 10, further comprising a connection tab that connects said dissipator to said frame; and wherein*

*said connection tab and said at least two connection fingers are constructed and arranged so that pressure exerted on the frame is transmitted to said dissipator.*

*18. A package for an integrated circuit, comprising:*

*a plastic case for embedding a chip of semiconductor material;*

*a plurality of leads extending from said plastic case; and*

*a dissipator for supporting the chip, the dissipator being integrally connected to at least one of said leads, said*

*dissipator having at least one connection finger that extends inside said plastic case and ends at a lateral surface of said plastic case, said at least one connection finger being curved in each of at least two orthogonal planes.*

*19. The package of claim 18, wherein said at least one connection finger includes at least two connection fingers.*

*20. The package of claim 19, further comprising a connection tab that integrally connects said dissipator to said at least one of said leads.*

*21. The package of claim 20, wherein the connection tab is curved in only a single plane.*

*22. The package of claim 21, wherein said dissipator is surrounded by said plastic case so that its face which supports said chip is completely covered by said plastic case and its opposite outer face extends flush with a surface of said plastic case and wherein said opposite outer face is uncovered by said plastic case.*

*23. The package of claim 18, wherein said dissipator is surrounded by said plastic case so that its face which supports said chip is completely covered by said plastic case and its opposite outer face extends flush with a surface of said plastic case and wherein said opposite outer face is uncovered by said plastic case.*

*24. An integrated circuit, comprising:*

*a dissipator having first and second faces;*

*a chip of semiconductor material supported on said first face of said dissipator;*

*a plurality of leads, each coupled to said chip, wherein at least one of said plurality of leads is integral with said dissipator and formed from a same piece of material; and*

*a plastic case that completely encases said chip and completely covers said first face of said dissipator, said plurality of leads extending from said plastic case.*

*25. The integrated circuit of claim 24, wherein said second face of said dissipator is not encased by said plastic case.*

*26. The package of claim 18, wherein said dissipator and the at least one of said leads integrally connected to the dissipator are formed from a same piece of material.*

*27. The package of claim 18, wherein the plastic case includes a plurality of lateral sides, and each of the plurality of leads extends from a same lateral side of the plastic case.*

*28. The package of claim 22, wherein said dissipator and the at least one of said leads integrally connected to the dissipator are formed from a same piece of material.*

*29. The package of claim 28, wherein the plastic case includes a plurality of lateral sides, and each of said plurality of leads extends from a first lateral side of the plastic case.*

*30. The package of claim 29, wherein each of the at least two connection fingers ends flush with a lateral side of the plastic case other than the first lateral side of the plastic case.*

*31. The package of claim 18, wherein the plastic case includes a plurality of lateral sides, and the at least one connection finger ends flush with a first lateral side of the plastic case.*

*32. The package of claim 31, wherein each of said plurality of leads extends from a second lateral side of the plastic case.*

*33. The integrated circuit of claim 24, wherein the plastic case includes a plurality of lateral sides, and each of said plurality of leads extends from a first lateral side of the plastic case.*

*34. The integrated circuit of claim 33, further comprising at least one connection finger that is formed from said same piece of material and is integral with said dissipator.*

*35. The integrated circuit of claim 34, wherein said at least one connection finger is curved.*

*36. The integrated circuit of claim 35, wherein said at least one connection finger ends flush at a second lateral side of said plastic case.*

*37. The integrated circuit of claim 35, wherein said at least one connection finger is curved in each of at least two orthogonal planes.*

*38. The integrated circuit of claim 24, wherein the plastic case is a continuous, integral component.*

*39. The package of claim 18, wherein the at least one connection finger is exposed at the lateral surface of said plastic case.*

* * * * *